United States Patent
Jeon et al.

(10) Patent No.: US 12,402,478 B2
(45) Date of Patent: *Aug. 26, 2025

(54) METHOD FOR PREPARING PIXEL DEFINE LAYER

(71) Applicant: DUK SAN NEOLUX CO., LTD., Cheonan-si (KR)

(72) Inventors: Seo Jeong Jeon, Cheonan-si (KR); Changmin Lee, Cheonan-si (KR); Yeon Soo Lee, Cheonan-si (KR); Jun Bae, Cheonan-si (KR); Jun Ki Kim, Cheonan-si (KR); Soung Yun Mun, Cheonan-si (KR); Kyung Soo Kim, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/449,075

(22) Filed: Aug. 14, 2023

(65) Prior Publication Data
US 2024/0065027 A1    Feb. 22, 2024

(30) Foreign Application Priority Data
Aug. 14, 2022 (KR) .......................... 10-2022-0101706

(51) Int. Cl.
| | | |
|---|---|---|
| *G03F 7/032* | (2006.01) | |
| *C08G 63/676* | (2006.01) | |
| *C08G 63/81* | (2006.01) | |
| *C08K 3/04* | (2006.01) | |
| *C09D 7/20* | (2018.01) | |
| *C09D 7/61* | (2018.01) | |
| *C09D 167/06* | (2006.01) | |
| *G03F 7/40* | (2006.01) | |
| *H10K 59/12* | (2023.01) | |
| *H10K 59/122* | (2023.01) | |
| *H10K 59/173* | (2023.01) | |

(52) U.S. Cl.
CPC ....... *H10K 59/1201* (2023.02); *C08G 63/676* (2013.01); *C08G 63/81* (2013.01); *C08K 3/04* (2013.01); *C09D 7/20* (2018.01); *C09D 7/61* (2018.01); *C09D 167/06* (2013.01); *G03F 7/032* (2013.01); *G03F 7/40* (2013.01); *H10K 59/122* (2023.02); *H10K 59/173* (2023.02)

(58) Field of Classification Search
CPC .... G03F 7/0007; G03F 7/0757; G03F 7/0758; G03F 7/032
See application file for complete search history.

(56) References Cited

U.S. PATENT DOCUMENTS

| | | | |
|---|---|---|---|
| 11,774,852 B2 * | 10/2023 | Bae | G03F 7/037 |
| | | | 430/285.1 |
| 11,920,025 B2 * | 3/2024 | Lee | H10K 85/111 |
| 2018/0259852 A1 * | 9/2018 | Tanigaki | H10K 50/00 |
| 2024/0085788 A1 * | 3/2024 | Bae | C08G 63/676 |
| 2024/0134272 A1 * | 4/2024 | Bae | G03F 7/40 |

FOREIGN PATENT DOCUMENTS

| | | |
|---|---|---|
| CN | 108027561 A | 5/2018 |
| CN | 108132583 A | 6/2018 |
| CN | 108445713 A | 8/2018 |
| CN | 114380945 A | 4/2022 |
| KR | 10-2017-0128678 A | 11/2017 |
| KR | 10-2019-0094797 A | 8/2019 |
| KR | 10-2022-0010122 A | 1/2022 |
| KR | 10-2022-0045744 A | 4/2022 |
| KR | 10-2022-0094479 A | 7/2022 |
| WO | 2022/145685 A1 | 7/2022 |

OTHER PUBLICATIONS

The Preliminary Office Action with translation for corresponding KR 10-2022-0101706; mailed May 1, 2023, 6 pages.
The Office Action with translation for corresponding KR 10-2022-0101706; mailed Sep. 4, 2023, 5 pages.
The Notice of Patent Allowance with translation for corresponding KR 10-2022-0101706; mailed Nov. 10, 2023, 7 pages.

* cited by examiner

*Primary Examiner* — Daborah Chacko-Davis
(74) *Attorney, Agent, or Firm* — Vorys, Sater, Seymour and Pease LLP; Mih Suhn Koh

(57) ABSTRACT

An object of the present disclosure is to implement a coloring pattern with a low amount of outgas on an electrode substrate to thereby increase reliability and lifetime of display as well as vivid colors of the same. That is, considering that when the amount of outgas in the panel after post-baking is 15 ppm or more, it may cause a reduction in luminance and lifetime due to pixel shrinkage, in order to minimize the amount of outgas after completion of the post-baking process, the generation of outgas in the panel state is minimized by generating sufficient fume in the post-baking step by way of including a colorant according to the present disclosure.

15 Claims, 6 Drawing Sheets

FIG. 1

Comparative Example 4

Comparative Example 5

Comparative Example 6

FIG. 2

Example 1

Example 2

Example 3

METHOD FOR PREPARING PIXEL DEFINE LAYER

TECHNICAL FIELD

The present disclosure relates to a method of preparing a pixel defining layer of a light emitting display device using a photosensitive composition.

BACKGROUND

As a flat panel display device, a liquid crystal display device (LCD), an organic light emitting display device (OLED), etc. are widely used. Among these, the organic light emitting display device has advantages such as low power consumption, a fast response speed, high color reproducibility, high luminance, and a wide viewing angle.

In the case of the organic light emitting display device, a polarizing film is used to block the light being reflected from the panel when external light is incident, and there is a disadvantage in that the polarizing film is not suitable for application to a flexible device due to a lack of bending properties.

As a method for solving the above problem, a method such as forming an inorganic film for blocking light on an upper substrate as well as a color filter and a black matrix has been proposed. However, these methods have limitations in obtaining a desired level of antireflection effect, and no specific methods for replacing the polarizing film have yet been suggested.

Meanwhile, coloring patterns are being used as red, green, and blue color filters not only in liquid crystal displays but also in organic light emitting displays.

When producing the coloring pattern, various types of organic pigments as well as carbon black and inorganic pigments are used as colorants, and a pigment dispersion in which these colorants are dispersed is mixed with other compositions to form a pattern.

An organic light emitting display prepared by the thus-formed pixels can implement more vivid colors. However, the coloring pattern has a large amount of outgas, when there is a large amount of outgas, problems such as pixel shrinkage, dark spots, and electrode oxidation occur, and the lifetime and luminance of the organic light emitting display decrease.

SUMMARY

In order to solve the problems of the conventional art, an object of the present disclosure is to implement a coloring pattern with a low amount of outgas on an electrode substrate to thereby increase reliability and lifetime of display as well as vivid colors of the same.

That is, considering that when the amount of outgas in the panel after post-baking is 15 ppm or more, it may cause a reduction in luminance and lifetime due to pixel shrinkage, in order to minimize the amount of outgas after completion of the post-baking process, the generation of outgas in the panel state is minimized by generating sufficient fume in the post-baking step.

In still another embodiment, the present disclosure provides an organic light emitting display device including a pixel defining layer prepared by the method described above.

In still another embodiment, the present disclosure provides an electronic device including the organic light emitting display device.

The method for preparing a pixel defining layer according to the present disclosure is preferably such that it includes application and coating; pre-baking; exposure to light; developing; and post-baking of a photosensitive composition, wherein the post-baking step is performed at an oven temperature of 210° C. to 300° C. for 30 to 120 minutes; the amount of fume generated in the post-baking is 86 ppm or more; and the amount of outgas generated after the post-baking step is 15 ppm or less.

More preferably, the oven temperature in the post-baking step is 250° C. to 270° C.

More preferably, the post-baking step is performed for 60 to 120 minutes.

Preferably, the photosensitive composition includes a colorant.

Preferably, the colorant includes one or more among inorganic dyes, organic dyes, inorganic pigments, and organic pigments.

Preferably, the colorant is included in an amount of 1 wt % to 40 wt % based on the total amount of the photosensitive composition.

Preferably, the colorant is pretreated using a dispersant; or a water-soluble inorganic salt and a wetting agent.

Preferably, the average particle diameter of the colorant is 20 nm to 110 nm.

Preferably, the photosensitive composition includes a patterning resin which includes an acryl-based binder resin, a cardo-based binder resin, or a combination thereof.

Preferably, the weight average molecular weight of the acryl-based binder resin is 3,000 g/mol to 150,000 g/mol.

Preferably, the cardo-based binder resin includes a repeat structure of Formula 1 below.

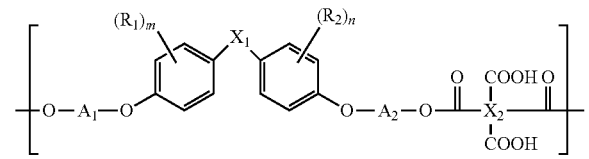

<Formula 1>

In Formula 1 above,
1) $R^1$ and $R^2$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
2) $R^1$ and $R^2$ are able to form a ring between neighboring groups,
3) m and n are each independently an integer of 0 to 4,
4) $A_1$ and $A_2$ are each independently Formula 2 or Formula 3 below:

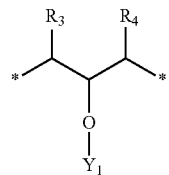

<Formula 2>

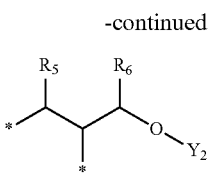
<Formula 3> in Formula 2 and Formula 3 above,
4-1) * represents a binding part,
4-2) $R^3$ to $R^6$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
4-3) $R^3$ to $R^6$ are able to form a ring between neighboring groups,
4-4) $Y^1$ and $Y^2$ are each independently Formula 6 or Formula 7 below:

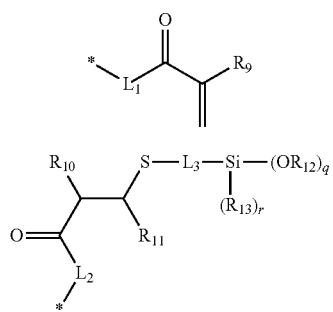

in Formula 6 and Formula 7 above,
4-4-1) * represents a binding position,
4-4-2) $R^9$ is hydrogen or methyl,
4-4-3) $R^{10}$ to $R^{11}$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
4-4-4) $L^1$ to $L^3$ are each independently a single bond, a fluorenylene group; $C_{2-30}$ alkylene; $C_{6-30}$ arylene; a $C_{2-30}$ heterocyclic ring; $C_{1-30}$ alkoxylene, $C_{2-30}$ alkyleneoxy; $C_{6-30}$ aryloxy; or $C_{2-30}$ polyethyleneoxy,
4-4-5) q and r are each independently an integer from 0 to 3; with the proviso that q+r=3, and
5) the ratio of $A_1$ and $A_2$ in the polymer chain of the resin including a repeating unit represented by Formula 1 above is 9:1 to 1:9,
6) $X^1$ is a single bond; O; CO; $SO_2$; CR'R"; SiR'R"; Formula 4 below; or Formula 5 below,
6-1) R' and R" are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
6-2) R' and R" are able to form a ring between neighboring groups,

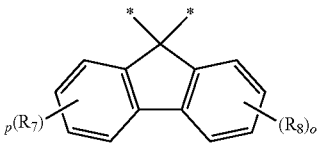
<Formula 4>

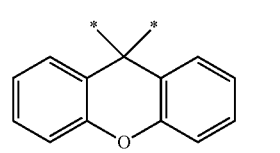
<Formula 5> in Formula 4 and Formula 5 above,
6-3) * represents a binding position,
6-4) $R^7$ and $R^8$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
6-5) o and p are each independently an integer from 0 to 4,
7) $X^2$ is a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
8) the R', R", $X^2$, $L^1$ to $L^3$, $R^1$ to $R^8$, and $R^{10}$ to $R^{13}$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

Preferably, the weight average molecular weight of the cardo-based binder resin is 1,000 g/mol to 100,000 g/mol.

Preferably, the cardo-based resin is included in an amount of 1 wt % to 30 wt % based on the total amount of the photosensitive composition.

Preferably, a reactive unsaturated compound is included in an amount of 1 wt % to 40 wt % based on the total amount of the photosensitive composition.

Preferably, a photoinitiator is included in an amount of 0.01 wt % to 10 wt % based on the total amount of the photosensitive composition.

In still another embodiment, preferably, the present disclosure provides a pixel defining layer prepared according to the method described above.

In still another embodiment, preferably, the present disclosure provides an organic light emitting display device including the pixel defining layer.

In still another embodiment, preferably, the present disclosure provides an electronic device including the display device and a control unit for operating the display device.

Advantageous Effects

An object of the present disclosure is to implement a coloring pattern with a low amount of outgas on an electrode substrate to thereby increase reliability and lifetime of display as well as vivid colors of the same. That is, considering that when the amount of outgas in the panel after post-baking is 15 ppm or more, it may cause a reduction in luminance and lifetime due to pixel shrinkage, in order to minimize the amount of outgas after completion of the post-baking process, the generation of outgas in the panel state is minimized by generating sufficient fume in the post-baking step by way of including a colorant according to the present disclosure.

BRIEF DESCRIPTION OF THE DRAWINGS

Figure 1:
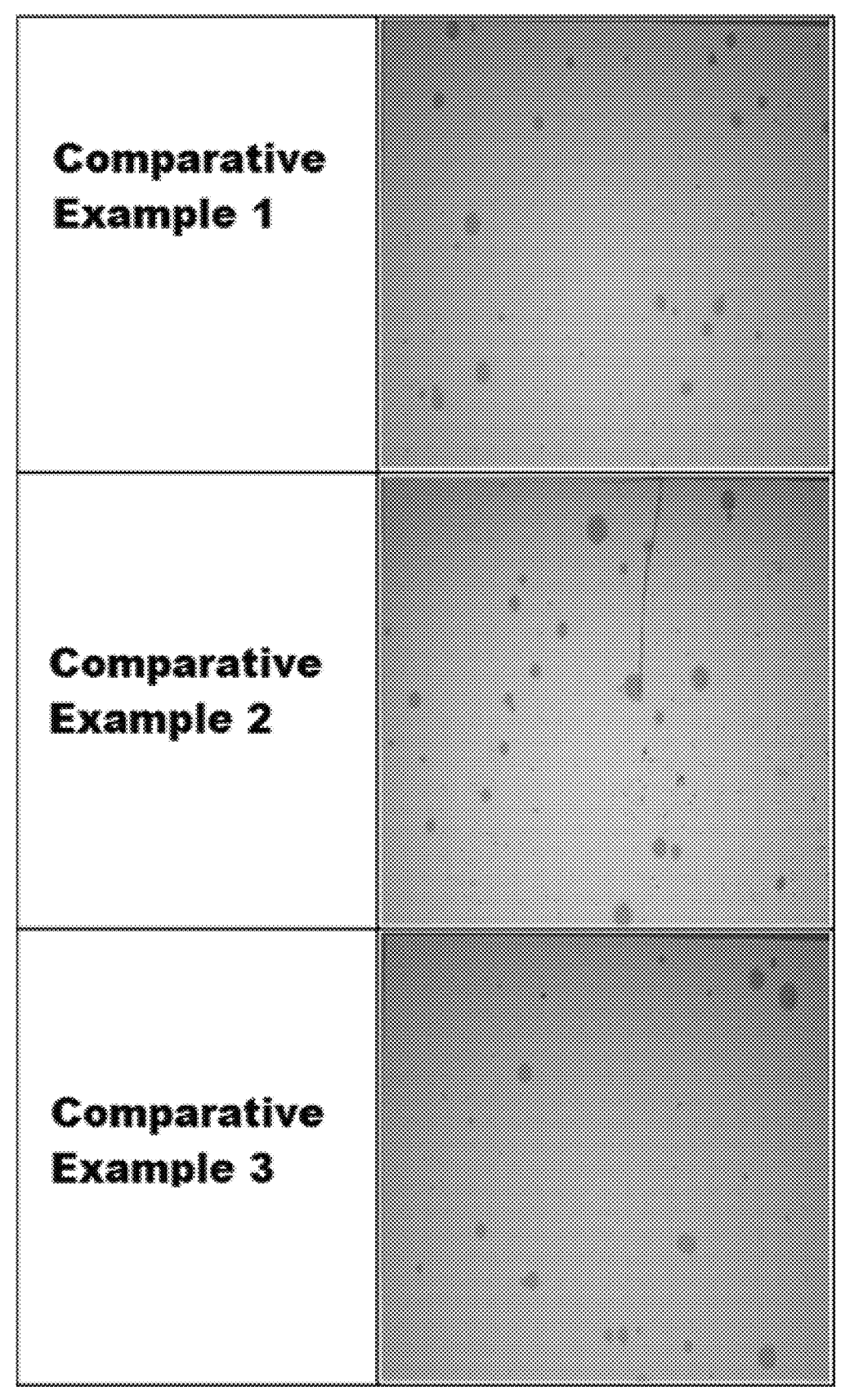

FIGS. 1 and 2 schematically illustrate pixel defining layers according to Comparative Examples 1 to 6 by photographing.

Figure 6:
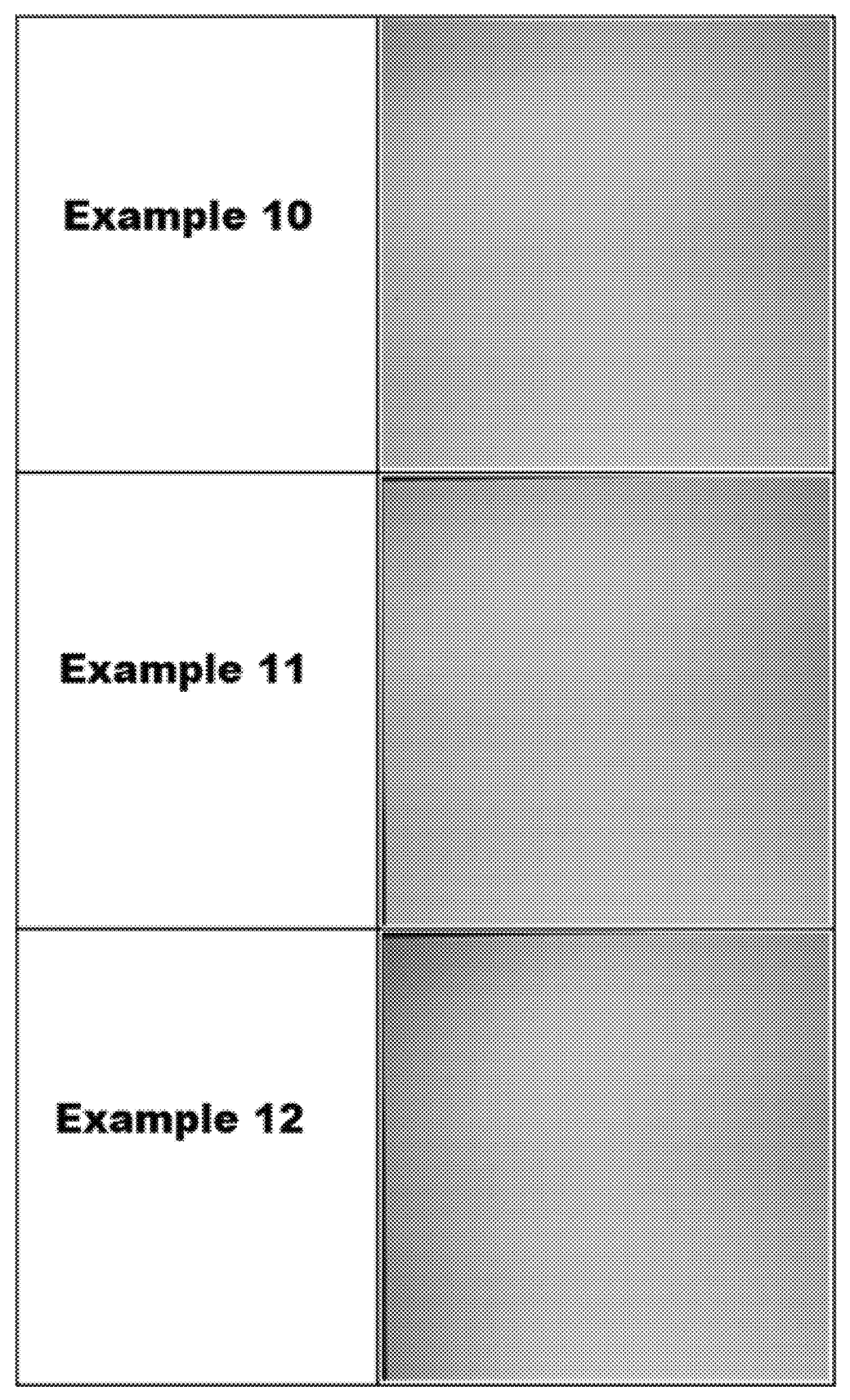

FIGS. 3 to 6 schematically illustrate pixel defining layers according to Examples 1 to 12 by photographing.

DETAILED DESCRIPTION

Figure 4:
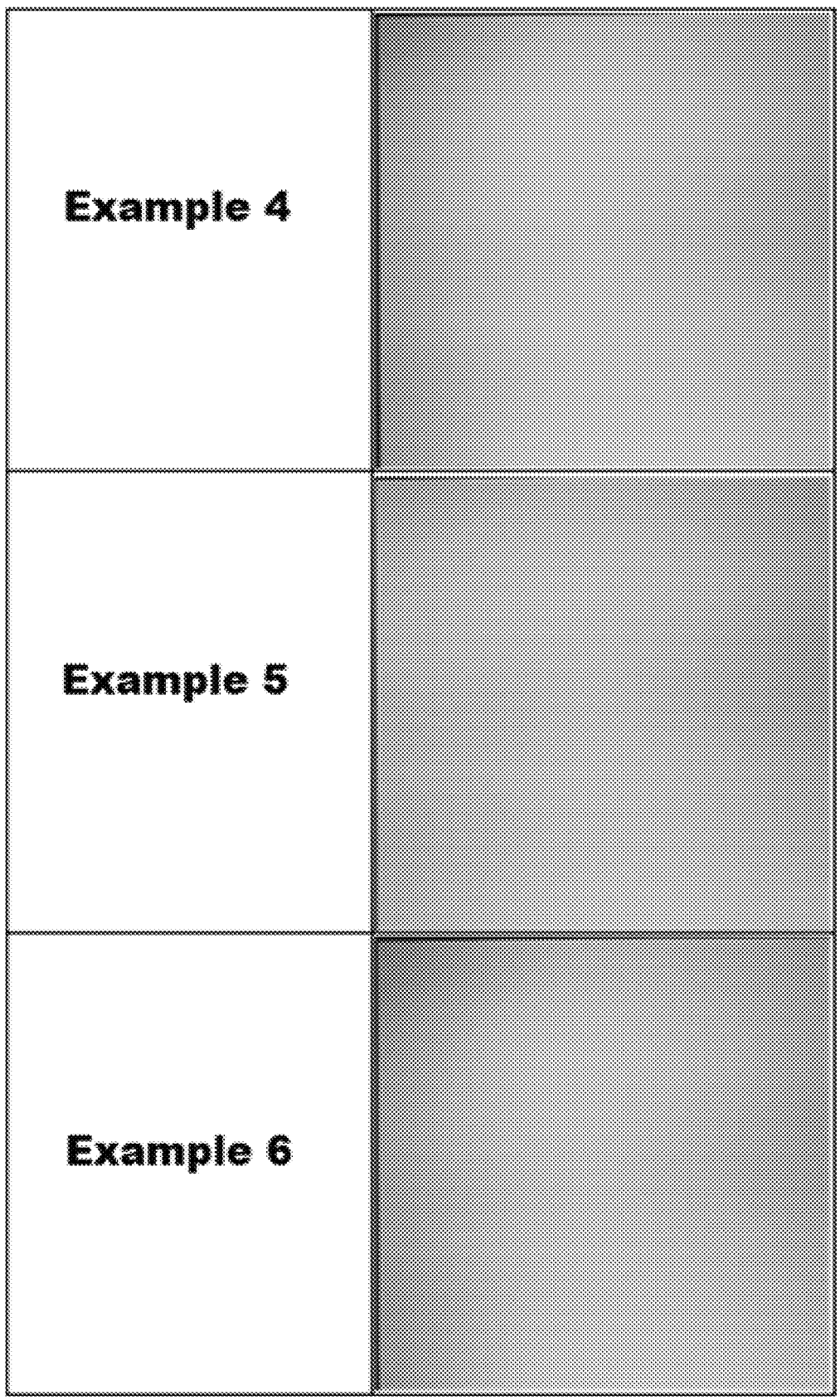

Hereinafter, some embodiments of the present disclosure will be described in detail with reference to exemplary drawings. In adding reference numerals to components of each drawing, the same components may have the same reference numerals even though they are indicated in different drawings.

When it is determined that a detailed description of a related known constitution or function may obscure the gist of the present disclosure in describing the present disclosure, the detailed description thereof may be omitted. When the expressions "includes", "has", "consisting of", etc. mentioned in this specification are used, other parts may be added unless "only" is used. When a component is expressed in the singular form, it may include a case in which the plural form is included unless otherwise explicitly stated.

Additionally, in describing the components of the present disclosure, terms such as first, second, A, B, (a), (b), etc. may be used. These terms are only for distinguishing the components from other components, and the essence, order, sequence, the number, etc. of the components are not limited by the terms.

In the description of the positional relationship of the components, when two or more components are described as being "connected", "linked", or "fused", etc., the two or more components may be directly "connected", "linked", or "fused", but it should be understood that the two or more components may also be "connected", "linked", or "fused" by way of a further "interposition" of a different component. In particular, the different component may be included in any one or more of the two or more components that are to be "connected", "linked", or "fused" to each other.

Additionally, when a component (e.g., a layer, a film, a region, a plate, etc.) is described to be "on top" or "on" of another component, it should be understood that this may also include a case where another component is "immediately on top of" as well as a case where another component is disposed therebetween. In contrast, it should be understood that when a component is described to be "immediately on top of" another component, it should be understood that there is no other component disposed therebetween.

In the description of the temporal flow relationship relating to the components, the operation method, or the preparation method, for example, when the temporal precedence or flow precedence is described by way of "after", "subsequently", "thereafter", "before", etc., it may also include cases where the flow is not continuous unless terms such as "immediately" or "directly" are used.

Meanwhile, when the reference is made to numerical values or corresponding information for components, numerical values or corresponding information may be interpreted as including an error range that may occur due to various factors (e.g., procedural factors, internal or external shocks, noise, etc.) even if it is not explicitly stated.

The terms used in this specification and the appended claims are as follows, unless otherwise stated, without departing from the spirit of the present disclosure.

As used herein, the term "halo" or "halogen" includes fluorine (F), chlorine (Cl), bromine (Br), and iodine (I), unless otherwise specified.

As used herein, the term "alkyl" or "alkyl group" refers to a radical of a saturated aliphatic functional group, including a linear chain alkyl group, a branched chain alkyl group, a cycloalkyl (alicyclic) group, an alkyl-substituted cycloalkyl group, and a cycloalkyl-substituted alkyl group, which has 1 to 60 carbons linked by a single bond unless otherwise specified.

As used herein, the term "haloalkyl group" or "halogenalkyl group" refers to an alkyl group in which a halogen is substituted, unless otherwise specified.

As used herein, the term "alkenyl" or "alkynyl" has a double bond or triple bond, respectively, includes a linear or branched chain group, and has 2 to 60 carbon atoms unless otherwise specified, but is not limited thereto.

As used herein, the term "cycloalkyl" refers to an alkyl which forms a ring having 3 to 60 carbon atoms unless otherwise specified, but is not limited thereto.

As used herein, the term "an alkoxy group" or "alkyloxy group" refers to an alkyl group to which an oxygen radical is linked, and has 1 to 60 carbon atoms unless otherwise specified, but is not limited thereto.

As used herein, the term "alkenoxyl group", "alkenoxy group", "alkenyloxyl group", or "alkenyloxy group" refers to an alkenyl group to which an oxygen radical is linked, and has 2 to 60 carbon atoms unless otherwise specified, but is not limited thereto.

As used herein, the terms "aryl group" and "arylene group" each have 6 to 60 carbon atoms unless otherwise specified, but are not limited thereto. As used herein, the aryl group or arylene group includes a single ring type, a ring assembly, a fused multiple ring compound, etc. For example, the aryl group may include a phenyl group, a monovalent functional group of biphenyl, a monovalent functional group of naphthalene, a fluorenyl group, and a substituted fluorenyl group, and the arylene group may include a fluorenylene group and a substituted fluorenylene group.

As used herein, the term "ring assembly" means that two or more ring systems (monocyclic or fused ring systems) are directly connected to each other through a single bond or double bond, in which the number of direct links between such rings is one less than the total number of ring systems in the compound. In the ring assembly, the same or different ring systems may be directly connected to each other through a single bond or double bond.

As used herein, since the aryl group includes a ring assembly, the aryl group includes biphenyl and terphenyl in which a benzene ring, which is a single aromatic ring, is connected by a single bond. Additionally, since the aryl group also includes a compound in which an aromatic ring system fused to an aromatic single ring is connected by a single bond, it also includes, for example, a compound in which a benzene ring (which is a single aromatic ring) and fluorine (which is a fused aromatic ring system) are linked by a single bond.

As used herein, the term "fused multiple ring system" refers to a fused ring form in which at least two atoms are shared, and it includes a form in which ring systems of two or more hydrocarbons are fused, a form in which at least one heterocyclic system including at least one heteroatom is fused, etc. Such a fused multiple ring system may be an aromatic ring, a heteroaromatic ring, an aliphatic ring, or a combination of these rings. For example, in the case of an aryl group, it may be a naphthalenyl group, a phenanthrenyl group, a fluorenyl group, etc., but is not limited thereto.

As used herein, the term "a spiro compound" has a spiro union, and the spiro union refers to a linkage in which two rings share only one atom. In particular, the atom shared by the two rings is called a "spiro atom", and they are each called "monospiro-", "dispiro-", and "trispiro-" compounds depending on the number of spiro atoms included in a compound.

As used herein, the terms "fluorenyl group", "fluorenylene group", and "fluorenetriyl group" refer to a monovalent, divalent, or trivalent functional group in which R, R', R'', and R''' are all hydrogen in the following structures, respectively, unless otherwise specified; "substituted fluorenyl group", "substituted fluorenylene group", or "substituted fluorenetriyl group" means that at least one of the substituents R, R', R'', and R''' is a substituent other than hydrogen, and includes cases where R and R' are bound to each other to form a spiro compound together with the carbon to which they are linked. As used herein, all of the fluorenyl group, the fluorenylene group, and the fluorenetriyl group may also be referred to as a fluorene group regardless of valences such as monovalent, divalent, trivalent, etc.

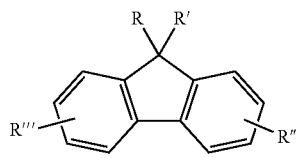

Additionally, the R, R', R'', and R''' may each independently be an alkyl group having 1 to 20 carbon atoms, an alkenyl group having 1 to 20 carbon atoms, an aryl group having 6 to 30 carbon atoms, and a heterocyclic group having 2 to 30 carbon atoms and, for example, the aryl group may be phenyl, biphenyl, naphthalene, anthracene, or phenanthrene, and the heterocyclic group may be pyrrole, furan, thiophene, pyrazole, imidazole, triazole, pyridine, pyrimidine, pyridazine, pyrazine, triazine, indole, benzofuran, quinazoline, or quinoxaline.

For example, the substituted fluorenyl group and the fluorenylene group may each be a monovalent functional group or divalent functional group of 9,9-dimethylfluorene, 9,9-diphenylfluorene, and 9,9'-spirobi[9H-fluorene].

As used herein, the term "heterocyclic group" includes not only aromatic rings (e.g., "heteroaryl group" and "heteroarylene group"), but also non-aromatic rings, and may refer to a ring having 2 to 60 carbon atoms each including one or more heteroatoms unless otherwise specified, but is not limited thereto. As used herein, the term "heteroatom" refers to N, O, S, P, or Si unless otherwise specified, and a heterocyclic group refers to a monocyclic group including a heteroatom, a ring assembly, a fused multiple ring system, a spiro compound, etc.

For example, the "heterocyclic group" may include a compound including a heteroatom group (e.g., $SO_2$, $P=O$, etc.), such as the compound shown below, instead of carbon that forms a ring.

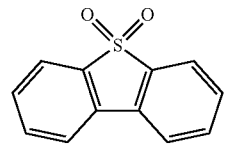 [SMILES: O=S1(=O)c2ccccc2-c2ccccc21]

As used herein, the term "ring" includes monocyclic and polycyclic rings, and includes heterocycles containing at least one heteroatom as well as hydrocarbon rings, and includes aromatic and non-aromatic rings.

As used herein, the term "polycyclic" includes ring assemblies (e.g., biphenyl, terphenyl, etc.), fused multiple ring systems, and spiro compounds, includes non-aromatic as well as aromatic compounds, and includes heterocycles containing at least one heteroatom as well as hydrocarbon rings.

As used herein, the term "alicyclic group" refers to cyclic hydrocarbons other than aromatic hydrocarbons, and it includes monocyclic, ring assemblies, fused multiple ring systems, spiro compounds, etc., and refers to a ring having 3 to 60 carbon atoms unless otherwise specified, but is not limited thereto. For example, when benzene (i.e., an aromatic ring) and cyclohexane (i.e., a non-aromatic ring) are fused, it also corresponds to an aliphatic ring.

Additionally, when prefixes are named consecutively, it means that the substituents are listed in the order they are described. For example, in the case of an arylalkoxy group, it means an alkoxy group substituted with an aryl group; in the case of an alkoxycarbonyl group, it means a carbonyl group substituted with an alkoxy group; additionally, in the case of an arylcarbonyl alkenyl group, it means an alkenyl group substituted with an arylcarbonyl group, in which the arylcarbonyl group is a carbonyl group substituted with an aryl group.

Additionally, unless otherwise specified, the term "substituted" in the expression "substituted or unsubstituted" as used herein refers to a substitution with one or more substituents selected from the group consisting of deuterium, a halogen, an amino group, a nitrile group, a nitro group, a $C_{1-30}$ alkyl group, a $C_{1-30}$ alkoxy group, a $C_{1-30}$ alkylamine group, a $C_{1-30}$ alkylthiophene group, a $C_{6-30}$ arylthiophene group, a $C_{2-30}$ alkenyl group, a $C_{2-30}$ alkynyl group, a $C_{3-30}$ cycloalkyl group, a $C_{6-30}$ aryl group, a $C_{6-30}$ aryl group substituted with deuterium, a $C_{8-30}$ arylalkenyl group, a silane group, a boron group, a germanium group, and a $C_{2-20}$ heterocyclic group containing one or more heteroatoms selected from the group consisting of O, N, S, Si, and P, but is not limited to these substituents.

As used herein, the "names of functional groups" corresponding to the aryl group, arylene group, heterocyclic group, etc. exemplified as examples of each symbol and a substituent thereof may be described as "a name of the functional group reflecting its valence", and may also be described as the "name of its parent compound". For example, in the case of "phenanthrene", which is a type of an aryl group, the names of the groups may be described such that the monovalent group is described as "phenanthryl (group)", and the divalent group is described as "phenanthrylene (group)", etc., but may also be described as "phenanthrene", which is the name of its parent compound, regardless of its valence.

Similarly, in the case of pyrimidine as well, it may be described regardless of its valence, or in the case of being monovalent, it may be described as pyrimidinyl (group); and in the case of being divalent, it may be described as the "name of the group" of the valence (e.g., pyrimidinylene (group)). Therefore, as used herein, when the type of a substituent is described as the name of its parent compound, it may refer to an n-valent "group" formed by detachment of a hydrogen atom linked to a carbon atom and/or hetero atom of its parent compound.

Additionally, in describing the names of the compounds or the substituents in the present specification, the numbers, letters, etc. indicating positions may be omitted. For example, pyrido[4,3-d]pyrimidine may be described as pyridopyrimidine; benzofuro[2,3-d]pyrimidine as benzofuropyrimidine; 9,9-dimethyl-9H-fluorene as dimethylfluorene, etc. Therefore, both benzo[g]quinoxaline and benzo[f]quinoxaline may be described as benzoquinoxaline.

Additionally, unless there is an explicit description, the formulas used in the present disclosure are applied in the same manner as in the definition of substituents by the exponent definition of the formula below.

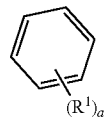

In particular, when a is an integer of 0, it means that the substituent $R^1$ is absent, that is, when a is 0, it means that hydrogens are linked to all carbons that form a benzene ring, and in this case, the formula or compound may be described while omitting the indication of the hydrogen linked to the carbon.

Additionally, when a is an integer of 1, one substituent IV may be linked to any one of the carbons forming a benzene ring; when a is an integer of 2 or 3, it may be linked, for example, as shown below; even when a is an integer of 4 to 6, it may be linked to the carbon of a benzene ring in a similar manner; and when a is an integer of 2 or greater, $R^1$ may be the same as or different from each other.

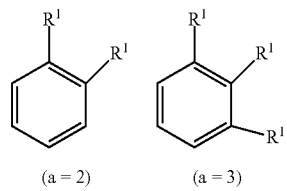

Unless otherwise specified in the present application, forming a ring means that neighboring groups bind to one another to form a single ring or fused multiple ring, and the single ring and the formed fused multiple ring include a heterocycle containing at least one heteroatom as well as a hydrocarbon ring, and may include aromatic and non-aromatic rings.

Additionally, unless otherwise specified in the present specification, when indicating a condensed ring, the number in "number-condensed ring" indicates the number of rings to be condensed. For example, a form in which three rings are condensed with one another (e.g., anthracene, phenanthrene, benzoquinazoline, etc.) may be expressed as a 3-condensed ring.

Meanwhile, as used herein, the term "bridged bicyclic compound" refers to a compound in which two rings share 3 or more atoms to form a ring, unless otherwise specified. In particular, the shared atoms may include carbon or a hetero atom.

In the present disclosure, an organic electric device may refer to a component(s) between a positive electrode and a negative electrode, or may refer to an organic light emitting diode which includes a positive electrode, a negative electrode, and a component(s) disposed therebetween.

Additionally, in some cases, the display device in the present disclosure may refer to an organic electric device, an organic light emitting diode, and a panel including the same, or may refer to an electronic device including a panel and a circuit. In particular, for example, the electronic device may include a lighting device, a solar cell, a portable or mobile terminal (e.g., a smart phone, a tablet, a PDA, an electronic dictionary, a PMP, etc.), a navigation terminal, a game machine, various TV sets, various computer monitors, etc., but is not limited thereto, and may be any type of device as long as it includes the component(s).

Hereinafter, embodiments of the present disclosure will be described in detail. However, these embodiments are provided for illustrative purposes, and the present disclosure is not limited thereby, and the present disclosure is only defined by the scope of the claims to be described later.

The composition containing a colorant according to an embodiment of the present disclosure may be used to prepare a pixel defining layer (PDL) with a red pattern, a green pattern, a blue pattern, or black matrix.

A black pixel defining layer (PDL) according to an embodiment of the present disclosure may further include an organic black pigment or black dye as an additional colorant other than the colorant included in the colorant described above. For example, an organic pigment may be used alone or in combination with organic pigments and colored pigments; in particular, there is an advantage in that the strength of the film (layer) or the adhesion to the substrate is not lowered even when the amount of the colorant is relatively increased because a color pigment having poor light shielding property is mixed. The negative pixel defining layer (PDL) according to an embodiment of the present disclosure may include a black pigment or black dye as an additional colorant instead of the colorant included in the colorant described above.

Hereinafter, each component will be described in detail.

1. The Process of Preparing a Negative Pixel Defining Layer is as Follows.

(1) Application and Coating

A photosensitive composition is a low-viscosity liquid sample, and after application on a substrate, it is coated with a certain thickness using a spin coater or slit coater. The spin coater has an advantage in that the flatness deviation in the area decreases while reducing the thickness as the number of revolutions increases, and a slit coater is preferable to a spin coater in order to coat a large area substrate. Due to the solvent remaining after coating, the surface can have fluidity, and this results in the disadvantage in that flatness becomes deteriorated. Therefore, in order to overcome the disadvantage, the fluidity on the surface is lowered by removing some of the solvent by vacuum chamber dry (VCD).

(2) Pre-Baking

This is a process of removing part of the solvent included in the coating film by heating the coated substrate with a hot plate or an oven at a predetermined temperature and time. When the surface or core of the coating film is not dried, photomask contamination occurs during exposure to light in the following process, and when irradiated with ultraviolet light, the part exposed to light does not harden well, and the pattern is not formed and removed in the developing process due to non-curing.

(3) Exposure to Light

This is a process that when the pre-baking process is finished, the formed film is cured by irradiating active rays (ultraviolet rays) using a patterned photo mask. Lamp types that generate active lines include LED lamps or metal (mercury) lamps; and wavelengths include g-line (436 nm), h-line (405 nm), i-line (365 nm), and deep UV (<260 nm), which can be used individually or in combination.

(4) Developing

In the light exposure step, when activating rays are irradiated, it is divided into the part exposed to light and the part not exposed to light by a photo mask. In the case of the positive type, the part exposed to light is melted by the developing liquid, and the part not exposed to light endures the developing liquid and the pattern remains. In the case of the negative type, the part exposed to light becomes hardened and resists the developing liquid, while the part not exposed to light becomes developed. The black pixel defining layer (PDL), which is prepared from a composition containing a colorant of the present disclosure, is a negative type and divided into the part exposed to light (curing) and the part not exposed to light (developing) to form a pattern.

(5) Post-Baking

This is a process to remove residual solvent and fume by applying heat to the developed substrate at a high temperature of 210° C. or higher. When the solvent and fume are not perfectly removed in the corresponding process, outgas is generated in the post-baking process and affects the device, which affects dark spots or pixel shrinkage.

2. A Composition Forming a Negative Pixel Defining Layer Containing a Colorant is as Follows.

(1) Resin for Patterning

The resin for patterning according to an embodiment of the present disclosure may include an acryl-based binder resin, a cardo-based binder resin, and a combination thereof.

The acryl-based binder resin is a copolymer of a first ethylenically unsaturated monomer and a second ethylenically unsaturated monomer copolymerizable therewith, and includes one or more acryl-based repeating units.

The first ethylenically unsaturated monomer is an ethylenically unsaturated monomer containing at least one carboxyl group, and specific examples thereof include acrylic acid, methacrylic acid, maleic acid, itaconic acid, fumaric acid, and a combination thereof. The first ethylenically unsaturated monomer may be included in an amount of 5 wt % to 50 wt %, for example, 10 wt % to 40 wt %, based on the total amount of the acryl-based binder resin.

The second ethylenically unsaturated monomer may include aromatic vinyl compounds (e.g., (alpha)-methylstyrene, vinyltoluene, vinylbenzyl methyl ether, etc.); unsaturated carboxylic acid ester compounds (e.g., methyl (meth)acrylate, ethyl (meth)acrylate, butyl (meth)acrylate, 2-hydroxyethyl (meth)acrylate, 2-hydroxy butyl (meth)acrylate, benzyl (meth)acrylate, cyclohexyl (meth)acrylate, phenyl (meth)acrylate, etc.); unsaturated carboxylic acid amino alkyl ester compounds (e.g., 2-aminoethyl (meth)acrylate, 2-dimethylaminoethyl (meth)acrylate, etc.); carboxylic acid vinyl ester compounds (e.g., vinyl acetate, etc.); unsaturated carboxylic acid glycidyl ester compounds (e.g., glycidyl (meth)acrylate, etc.); vinyl cyanide compounds (e.g., (meth)acrylonitrile, etc.); unsaturated amide compounds (e.g., (meth)acrylamide, etc.); etc., and these may be used alone or in combination of two or more.

Specific examples of the acryl-based binder resin may include a (meth)acrylic acid/benzyl methacrylate copolymer, a (meth)acrylic acid/benzyl methacrylate/styrene copolymer, a (meth)acrylic acid/benzyl methacrylate/2-hydroxyethyl methacrylate copolymer, a (meth)acrylic acid/benzyl methacrylate/styrene/2-hydroxyethyl methacrylate copolymer, etc., but are not limited thereto. These may be used alone or in combination of two or more. The weight average molecular weight of the acryl-based binder resin may be 3,000 g/mol to 150,000 g/mol, for example, 5,000 g/mol to 50,000 g/mol, for example, 20,000 g/mol to 30,000 g/mol.

The cardo-based resin includes a repeat structure such as Formula 1 below.

<Formula 1>

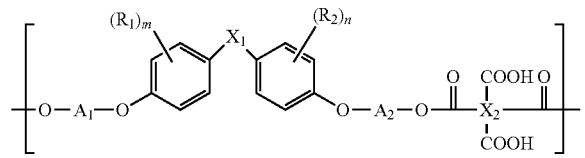

In Formula 1 above,

1) $R^1$ and $R^2$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 2) $R^1$ and $R^2$ are able to form a ring between neighboring groups, 3) m and n are each independently an integer of 0 to 4, 4) $A_1$ and $A_2$ are each independently Formula 2 or Formula 3 below:

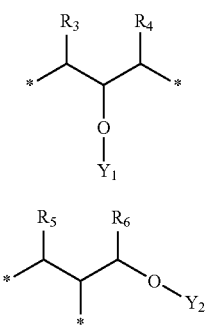

<Formula 2>

<Formula 3> in Formula 2 and Formula 3 above,
4-1) * represents a binding part,
4-2) $R^3$ to $R^6$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
4-3) $R^3$ to $R^6$ are able to form a ring between neighboring groups,
4-4) $Y^1$ and $Y^2$ are each independently Formula 6 or Formula 7 below:

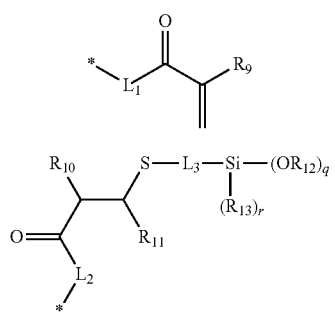

<Formula 6>

<Formula 7> in Formula 6 and Formula 7 above,
4-4-1) * represents a binding position,
4-4-2) $R^9$ is hydrogen or methyl,
4-4-3) $R^{10}$ to $R^{11}$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
4-4-4) $L^1$ to $L^3$ are each independently a single bond, a fluorenylene group; $C_{2-30}$ alkylene; $C_{6-30}$ arylene; a $C_{2-30}$ heterocyclic ring; $C_{1-30}$ alkoxylene, $C_{2-30}$ alkyleneoxy; $C_{6-30}$ aryloxy; or $C_{2-30}$ polyethyleneoxy,
4-4-5) q and r are each independently an integer from 0 to 3; with the proviso that q+r=3, and
5) the ratio of $A_1$ and $A_2$ in the polymer chain of the resin including a repeating unit represented by Formula 1 above is 9:1 to 1:9,
6) $X^1$ is a single bond; O; CO; SO2; CR'R"; SiR'R"; Formula 4 below; or Formula 5 below,
6-1) R' and R" are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
6-2) R' and R" are able to form a ring between neighboring groups,

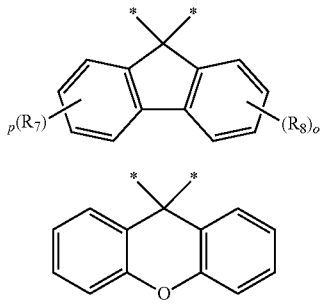

<Formula 4>

<Formula 5> in Formula 4 and Formula 5 above,
6-3) * represents a binding position,
6-4) $R^7$ and $R^8$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
6-5) o and p are each independently an integer from 0 to 4,
7) $X^2$ is a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
8) the R', R", $X^2$, $L^1$ to $L^3$, $R^1$ to $R^8$, and $R^{10}$ to $R^{13}$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

When the R', R", $X^2$, $L^1$ to $L^3$, $R^1$ to $R^8$, and $R^{10}$ to $R^{13}$ are an aryl group, preferably, it may be a $C_{6-30}$ aryl group, and more preferably, a $C_{6-18}$ aryl group (e.g., phenyl, biphenyl, naphthyl, terphenyl, etc.).

When the R', R", $X^2$, $L^1$ to $L^3$, $R^1$ to $R^8$, and $R^{10}$ to $R^{13}$ are a heterocyclic group, preferably, it may be a $C_{2-30}$ heterocyclic group, and more preferably, a $C_{2-18}$ heterocyclic group (e.g., dibenzofuran, dibenzothiophene, naphthobenzothiophene, naphthobenzofuran, etc.).

When the R', R", $R^1$ to $R^8$, and $R^{10}$ to $R^{13}$ are a fluorenyl group, preferably, it may be 9,9-dimethyl-9H-fluorene, 9,9-diphenyl-9H-fluorenyl group, 9,9'-spirobifluorene, etc.

When the $L^1$ to $L^3$ are an arylene group, preferably, it may be a $C_{6-30}$ arylene group, and more preferably, a $C_{6-18}$ arylene group (e.g., phenyl, biphenyl, naphthyl, terphenyl, etc.).

When the R', R", $X^2$, $R^1$ to $R^8$, and $R^{10}$ to $R^{13}$ are an alkyl group, preferably, it may be a $C_{1-10}$ alkyl group (e.g., methyl, t-butyl, etc.).

When the R', R", $X^2$, $R^1$ to $R^8$, and $R^{10}$ to $R^{13}$ are an alkoxyl group, preferably, it may be a $C_{1-20}$ alkoxyl group, and more preferably, a $C_{1-10}$ alkoxyl group (e.g., Methoxy, t-butoxy, etc.).

Rings formed by binding between the neighboring groups of R', R", $X^2$, $L^1$ to $L^3$, $R^1$ to $R^8$, and $R^{10}$ to $R^{13}$ may be a $C_{6-30}$ aromatic ring; a fluorenyl group; a $C_{2-60}$ heterocyclic group including at least one heteroatom among O, N, S, Si, and P; and a $C_{3-60}$ aromatic ring, and for example, when neighboring groups bind with each other to form an aromatic ring, preferably, a $C_{6-20}$ aromatic ring, and more preferably a $C_{6-14}$ aromatic ring (e.g., benzene, naphthalene, phenanthrene, etc.) may be formed.

The cardo-based resin may be prepared by combining two or more among, for example, fluorene-containing compounds (e.g., 9,9-bis(4-oxiranylmethoxyphenyl)fluorene, etc.); anhydride compounds (e.g., a benzene tetracarboxylic acid dianhydride, a naphthalene tetracarboxylic acid dianhydride, a biphenyltetracarboxylic acid dianhydride, a benzophenonetetracarboxylic acid dianhydride, a pyromellitic acid dianhydride, a cyclobutanetetracarboxylic acid dianhydride, a perylenetetracarboxylic acid dianhydride, a tetrahydrofurantetracarboxylic acid dianhydride, a tetrahydrophthalic acid anhydride, etc.); glycol compounds (e.g., ethylene glycol, propylene glycol, polyethylene glycol, etc.); alcohol compounds (e.g., methanol, ethanol, propanol, n-butanol, cyclohexanol, benzyl alcohol, etc.); solvent compounds; (e.g., propylene glycol methylethyl acetate, N-methylpyrrolidone, etc.); phosphorus compounds (e.g., triphenylphosphine, etc.); and amine or ammonium salt compounds (e.g., tetramethylammonium chloride, tetraethylammonium bromide, benzyldiethylamine, triethylamine, tributylamine, benzyltriethylammonium chloride, etc.).

The weight average molecular weight of the cardo-based resin is 1,000 g/mol to 100,000 g/mol, preferably 1,000 to 50,000 g/mol, more preferably 1,000 g/mol to 30,000 g/mol. When the weight average molecular weight of the resin is within the above range, the pattern formation is well performed without residue during the preparation of a light shielding layer, and there is no loss of film thickness during development, and a good pattern can be obtained. The resin may be included in an amount of 1 wt % to 30 wt %, and more preferably 3 wt % to 20 wt %, based on the total amount of the photosensitive resin composition. When the resin is included within the above range, excellent sensitivity, developing ability and adhesiveness (adhesiveness) can be obtained.

(2) Reactive Unsaturated Compounds

The reactive unsaturated compounds essential for the negative pattern, by having an ethylenically unsaturated double bond, can form a pattern having excellent heat resistance, light resistance, and chemical resistance by causing sufficient polymerization during exposure to light in the pattern forming process.

Specific examples of the reactive unsaturated compound may be ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, dipentaerythritol pentaacrylate, dipentaerythritol hexaacrylate, bisphenol A epoxy acrylate, ethylene glycol monomethyl ether acrylate, trimethylolpropane triacrylate, tripentaerythritol octaacrylate, etc.

Examples of commercially available products of the reactive unsaturated compounds are as follows.

Examples of the bifunctional ester of (meth)acrylic acid may include Aronix M-210, M-240, M-6200, etc. (Toa Kosei Kagaku Kogyo Co., Ltd.), KAYARAD HDDA, HX-220, R-604, etc. (Nippon Kayaku Co., Ltd.), and V-260, V-312, V-335 HP, etc. (Osaka Yuki Kagaku Kogyo Co., Ltd.).

Examples of the trifunctional ester of (meth)acrylic acid include M-309, M-400, M-405, M-450, M-7100, M-8030, M-8060, etc. (Toa Kosei Kagaku Kogyo Co., Ltd.), KAYARAD TMPTA, DPCA-20, DPCA-60, DPCA-120, etc. (Nippon Kayaku Co., Ltd.), and V-295, V-300, V-360, etc. (Osaka Yuki Kagaku Kogyo Co., Ltd.).

These products may be used alone or in combination of two or more.

The reactive unsaturated compound may be used after treating with an acid anhydride so as to provide improved developability. The reactive unsaturated compound may be included in an amount of 1 wt % to 40 wt %, for example, 1 wt % to 20 wt %, based on the total amount of the photosensitive composition. When the reactive unsaturated compound is included within the above range, sufficient curing occurs during exposure to light in the pattern forming process, thus obtaining excellent reliability, excellent heat resistance, light resistance, and chemical resistance of the pattern, and also excellent resolution and adhesion.

(3) Photoinitiator

In order to implement a negative pattern by photolithography, a photoradical initiator must be used. The photoinitiator is a photoinitiator which has a molar absorption coefficient of 10,000 (L/mol·cm) or more in the region of 330 nm to 380 nm and a 5 wt % loss occurring at 200° C. or less. In particular, the molar extinction coefficient can be calculated by the beer-Lambert Law. In addition, the weight loss was measured by raising the temperature to 300° C. at a rate of 5° C. per minute under a nitrogen atmosphere using TGA.

The photoinitiator is an initiator commonly used in photosensitive resin compositions, and for example, an acetophenone-based compound, a benzophenone-based compound, a thioxanthone-based compound, a benzoin-based compound, a triazine-based compound, etc. may be used.

Examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethyl amino-1-(4-morpholinophenyl)-butan-1-one, etc.

Examples of the benzophenone-based compound may include benzophenone, benzoyl benzoate, methyl benzoyl benzoate, 4-phenyl benzophenone, hydroxy benzophenone, acrylated benzophenone, 4,4'-bis (dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, etc.

Examples of the thioxanthone-based compound may include thioxanthone, 2-chlorthioxanthone, 2-methylthioxanthone, isopropyl thioxanthone, 2,4-diethyl thioxanthone, 2,4-diisopropyl thioxanthone, 2-chlorothioxanthone, etc.

Examples of the benzoin-based compound may include benzoin, benzoin methyl ether, benzoin ethyl ether, benzoin isopropyl ether, benzoin isobutyl ether, benzyldimethyl ketal, etc.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine; 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis (tri chloromethyl)-s-triazine, 2-4-trichloromethyl(piperonyl)-6-triazine, 2-4-trichloromethyl(4'-methoxystyryl)-6-triazine, etc.

As the photoinitiator, a carbazole-based compound, a diketone-based compound, a sulfonium borate-based compound, a diazo-based compound, an imidazole-based compound, or a non-imidazole-based compound may be used in addition to the compounds described above.

As the photoinitiator, which is a radical polymerization initiator, a peroxide-based compound, an azobis-based compound, etc. may be used.

Examples of the peroxide-based compound may include ketone peroxides (e.g., methyl ethyl ketone peroxide, methyl isobutyl ketone peroxide, cyclohexanone peroxide, methylcyclohexanone peroxide, acetylacetone peroxide, etc.); diacyl peroxides (e.g., isobutyryl peroxide, 2,4-dichlorobenzoyl peroxide, o-methylbenzoyl peroxide, bis-3,5,5-trimethylhexanoyl peroxide, etc.); hydroperoxides (e.g., 2,4, 4-trimethylpentyl-2-hydroperoxide, diisopropylbenzene hydroperoxide, cumene hydroperoxide, t-butyl hydroperoxide, etc.); dialkyl peroxides (e.g., dicumyl peroxide, 2,5-dimethyl-2,5-di(t-butylperoxy)hexane, 1,3-bis(t-butyloxyisopropyl)benzene, t-butylperoxyvalerate n-butyl ester, etc.); alkyl peresters (e.g., 2,4,4-trimethylpentyl peroxyphenoxyacetate, α-cumyl peroxyneodecanoate, t-butyl peroxybenzoate, di-t-butyl peroxytrimethyl adipate, etc.); percarbonates (e.g., di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyaryl carbonate, etc.), etc.

Examples of the azobis-based compound may include 1,1'-azobiscyclohexan-1-carbonitrile, 2,2'-azobis(2,4-dimethylvaleronitrile), 2,2-azobis(methylisobutyrate), 2,2'-azobis(4-methoxy-2,4-dimethylvaleronitrile), α,α'-azobis(isobutylnitrile), 4,4'-azobis(4-cyanovaleric acid), etc.

The photoinitiator may be used together with a photosensitizer that causes a chemical reaction by absorbing light to enter an excited state and then transferring the energy. Examples of the photosensitizer may include tetraethylene glycol bis-3-mercaptopropionate, pentaerythritol tetrakis-3-mercaptopropionate, dipentaerythritol tetrakis-3-mercaptopropionate, etc.

The photoinitiator may be included in an amount of 0.01 wt % to 10 wt %, for example, 0.1 wt % to 5 wt %, based on the total amount of the photosensitive resin composition. When the photoinitiator is included within the above range, it is possible to obtain excellent reliability due to sufficient curing that occurs during exposure to light in the pattern forming process, thereby obtaining excellent heat resistance, light resistance, and chemical resistance of the pattern, and also obtaining excellent resolution and adhesion, and being capable of preventing a decrease in transmittance due to an unreacted initiator.

(4) Colorant

As the colorant, all of organic and inorganic pigments and dyes can be used.

As the colorant, a red pigment, a green pigment, a blue pigment, a yellow pigment, a black pigment, etc. can be used.

Examples of the red pigment may include C.I. Pigment Red 254, C.I. Pigment Red 255, C.I. Pigment Red 264, C.I. Pigment Red 270, C.I. Pigment Red 272, C.I. Pigment Red 177, C.I. Pigment Red 89, etc.

Examples of the green pigment may include halogen-substituted copper phthalocyanine pigments (e.g., C.I. Pigment Green 36, C.I. Pigment Green 7, etc.).

Examples of the blue pigment may include copper phthalocyanine pigments (e.g., C.I. Pigment Blue 15:6, C.I. Pigment Blue 15, C.I. Pigment Blue 15:1, C.I. Pigment Blue 15:2, C.I. Pigment Blue 15:3, C.I. Pigment Blue 15:4, C.I. Pigment Blue 15:5, C.I. Pigment Blue 16, etc.).

Examples of the yellow pigment may include isoindoline-based pigments (e.g., C.I. Pigment Yellow 139, etc.), quinophthalone-based pigments (e.g., C.I. Pigment Yellow 138, etc.), nickel complex pigments (e.g., C.I. Pigment Yellow 150, etc.), etc.

Examples of the black pigment may include, for example, lactam black, aniline black, perylene black, titanium black, carbon black, etc.

In addition, the colorant in the photosensitive resin composition according to an embodiment may include a pigment, a dye, or a combination thereof. For example, the dye may include a phthalocyanine-based compound.

The pigments and dyes may be used alone or in combination of two or more, but are not limited to these examples.

Among them, the black pigment may be used to for the light shielding layer to effectively block the light. When the black pigment is used, it may be used together with color correcting agents such as anthraquinone-based pigments, perylene-based pigments, phthalocyanine-based pigments, azo-based pigments, etc.

In order to disperse the pigment in the photosensitive resin composition, a dispersant may be used together. Specifically, the surface of the pigment may be used after treating with a dispersant in advance, or a dispersant may be added together with the pigment during preparation of the photosensitive resin composition.

As the dispersant, a nonionic dispersant, an anionic dispersant, a cationic dispersant, etc. may be used. Specific examples of the dispersant may include polyalkylene glycol and an ester thereof, polyoxyalkylene, a polyhydric alcohol ester alkylene oxide adduct, an alcohol alkylene oxide adduct, a sulfonic acid ester, a sulfonic acid salt, a carboxylic acid ester, a carboxylic acid salt, an alkylamide alkylene oxide adduct, alkyl amine, etc., and these may be used alone or in combination of two or more.

Examples of commercially available products of the dispersant include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, etc., by BYK; EFKA-47, EFKA-47EA, EFKA-48, EFKA-49, EFKA-100, EFKA-400, EFKA-450, etc. by EFKA Chemical; and Solsperse 5000, Solsperse 12000, Solsperse 13240, Solsperse 13940, Solsperse 17000, Solsperse 20000, Solsperse 24000GR, Solsperse 27000, Solsperse 28000, etc. by Zeneka; or PB711, PB821, etc. by Ajinomoto.

The dispersant may be included in an amount of 0.1 wt % to 15 wt % based on the total amount of the photosensitive resin composition. When the dispersant is included within the above range, the dispersibility of the composition is excellent, and thus, its stability, developability, and patternability are excellent when preparing the light blocking layer.

The pigment may be used after pretreatment using a water-soluble inorganic salt and a wetting agent. When the pigment is used after pretreatment as described above, the average particle size of the pigment can be micronized.

The pretreatment may be performed through the step of kneading the pigment with a water-soluble inorganic salt and a wetting agent, and the step of filtering and washing the pigment obtained in the kneading step.

The kneading may be performed at a temperature of 40° C. to 100° C., and the filtration and washing may be performed by filtration after washing the inorganic salt with water, etc.

Examples of the water-soluble inorganic salt may include sodium chloride, potassium chloride, etc., but are not limited thereto.

The wetting agent serves as a medium through which the pigment and the water-soluble inorganic salt are uniformly mixed and the pigment can easily be pulverized, and examples of the wetting agent may include alkylene glycol monoalkyl ethers (e.g., ethylene glycol monoethyl ether, propylene glycol monomethyl ether, diethylene glycol monomethyl ether, etc.); alcohols (e.g., ethanol, isopropanol, butanol, hexanol, cyclohexanol, ethylene glycol, diethylene glycol, polyethylene glycol, glycerin polyethylene glycol, etc.), etc. and these may be used alone or in combination of two or more.

The pigment that has undergone the kneading step may have an average particle diameter of 20 nm to 110 nm. When the average particle diameter of the pigment is within the above range, it can effectively form fine patterns while having excellent heat resistance and light resistance.

The pigment may be included in an amount of 1 wt % to 40 wt %, and more specifically 2 wt % to 30 wt %, based on the total amount of the photosensitive resin composition. When the pigment is included within the above range, the color reproduction rate is excellent, and the curability and adhesion of the pattern are excellent.

(5) Solvent

As the solvent, materials may be used which are compatible with the cardo-based resin, the reactive unsaturated compound, the pigment, the cardo-based compound, and the photoinitiator, but do not react.

Examples of the solvent include alcohols (e.g., methanol, ethanol, etc.); ethers (e.g., dichloroethyl ether, n-butyl ether, diisoamyl ether, methylphenyl ether, tetrahydrofuran, etc.); glycol ethers (e.g., ethylene glycol monomethyl ether, ethylene glycol monoethyl ether, etc.); cellosolve acetates (e.g., methyl cellosolve acetate, ethyl cellosolve acetate, diethyl cellosolve acetate, etc.); carbitols (e.g., methylethyl carbitol, diethyl carbitol, diethylene glycol monomethyl ether, diethylene glycol monoethyl ether, diethylene glycol dimethyl ether, diethylene glycol methyl ethyl ether, diethylene glycol diethyl ether, etc.); propylene glycol alkyl ether acetates (e.g., propylene glycol methyl ether acetate, propylene glycol propyl ether acetate, etc.); aromatic hydrocarbons (e.g., toluene, xylene, etc.); ketones (e.g., methyl ethyl ketone, cyclohexanone, 4-hydroxy-4-methyl-2-pentanone, methyl-n-propyl ketone, methyl-n-butyl ketone, methyl-n-amyl ketone, 2-heptanone, etc.); saturated aliphatic monocarboxylic acid alkyl esters (e.g., ethyl acetate, n-butyl acetate, isobutyl acetate, etc.); lactic acid esters (e.g., methyl lactate and ethyl lactate); oxyacetic acid alkyl esters (e.g., methyloxyacetate, ethyloxyacetate, butyl oxyacetate, etc.); alkoxy acetate alkyl esters (e.g., methoxy methyl acetate, methoxy ethyl acetate, methoxy butyl acetate, ethoxy methyl acetate, ethoxy ethyl acetate, etc.); 3-oxypropionic acid alkyl esters (e.g., 3-oxy methyl propionate, 3-oxy ethyl propionate, etc.); 3-alkoxy propionic acid alkyl esters (e.g., 3-methoxy methyl propionate, 3-methoxy ethyl propionate, 3-ethoxy ethyl propionate, 3-ethoxy methyl propionate, etc.); 2-oxypropionic acid alkyl esters (e.g., methyl 2-oxypropionate, ethyl 2-oxypropionate, propyl 2-oxypropionate, etc.); 2-alkoxy propionic acid alkyl esters (e.g., 2-methoxy methyl propionate, 2-methoxy ethyl propionate, 2-ethoxy ethyl propionate, 2-ethoxy methyl propionate, etc.); 2-oxy-2-methyl propionic acid esters (e.g., 2-oxy-2-methyl methyl propionate, 2-oxy-2-methyl ethyl propionate, etc.); monooxy monocarboxylic acid alkyl esters of 2-alkoxy-2-methyl propionic acid alkyls (e.g., 2-methoxy-2-methyl methyl propionate, 2-ethoxy-2-methyl ethyl propionate, etc.); esters (e.g., 2-hydroxyethyl propionate, 2-hydroxy-2-methyl ethyl propionate, ethyl hydroxyacetate, 2-hydroxy-3-methyl methyl butanoate, etc.); ketonic acid esters (e.g., ethyl pyruvate, etc.), etc.

Further, high boiling point solvents such as N-methylformamide, N,N-dimethylformamide, N-methylformanilad, N-methylacetamide, N,N-dimethylacetamide, N-methylpyrrolidone, dimethyl sulfoxide, benzylethyl ether, dihexyl ether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate may also be used.

Among the solvents above, considering compatibility and reactivity, the following solvents may be used: glycol ethers (e.g., ethylene glycol monoethyl ether, etc.); ethylene glycol alkyl ether acetates (e.g., ethyl cellosolve acetate, etc.); esters (e.g., ethyl 2-hydroxypropionate, etc.); carbitols (e.g., diethylene glycol monomethyl ether, etc.); and propylene glycol alkyl ether acetates (e.g., propylene glycol methyl ether acetate, propylene glycol propyl ether acetate, etc.).

The solvent may be included as a balance based on the total amount of the photosensitive resin composition, and specifically in the amount of 40 wt % to 90 wt %. When the solvent is included within the above range, the photosensitive resin composition has an appropriate viscosity, and thus the processability becomes excellent when preparing the pattern layer.

(6) Other Additives

In order to prevent stains or spots during application, to improve leveling performance, and also to prevent the generation of undeveloped residues, the photosensitive composition may further include other additives such as malonic acid; 3-amino-1,2-propanediol; a silane-based coupling agent including a vinyl group or (meth)acryloxy group; a leveling agent; a fluorine-based surfactant; and a radical polymerization initiator.

For example, the photosensitive resin composition may further include a silane-based coupling agent having a reactive substituent such as a vinyl group, a carboxyl group, a methacryloxy group, an isocyanate group, and an epoxy group in order to improve adhesion, etc. to a substrate.

Examples of the silane-based coupling agent may include trimethoxysilyl benzoic acid, γ-methacryloxypropyl trimethoxysilane, vinyl triacetoxysilane, vinyl trimethoxysilane, γ-isocyanate propyl triethoxysilane, γ-glycidoxy propyl trimethoxy silane, β-epoxy cyclohexyl ethyl trimethoxy silane, etc., and these may be used alone or in combination of 2 or more types.

The silane-based coupling agent may be included in an amount of 0.01 part by weight to 10 parts by weight based on 100 parts by weight of the photosensitive resin composition. When the silane-based coupling agent is included within the above range, adhesion, storability, etc. become excellent.

In addition, the photosensitive resin composition may further include a surfactant (e.g., a fluorine-based surfactant) in order to improve coating properties and prevent formation of defects, if necessary.

As the fluorine-based surfactant, fluorine-based surfactants commercially available under the following names can be used: BM-1000®, BM-1100°, etc. by BM Chemie; F 142D Dainippon. Inky Kagaku Kogyo Mecca Pack F 142D®, 172®, F 173®, F 183®, Prorad FC-135®, FC-170®, FC-430®, and FC-431® by Sumitomo 3M; Saffron S-112®, S-113®, S-131®, S-141®, S-145® by Asahi Grass; SH-28PA®, SH-190®, SH-193®, SZ-6032®, SF-8428®, etc.

The surfactant may be used in an amount of 0.001 to 5 parts by, weight based on 100 parts by weight of the photosensitive resin composition, and when the surfactant is included within the above range, coating uniformity may be secured and stains may not occur and wetting is excellent. In addition, a certain amount of other additives such as antioxidants and stabilizers may be added to the photosensitive resin composition within a range that does not impair physical properties.

In another embodiment, patterning may be performed on the pixel separation portion of the organic light emitting device electrode using the photosensitive resin composition described above.

Hereinafter, Synthesis Examples and Examples of the present disclosure will be described in detail; however, these Synthesis Examples and Examples of the present disclosure are not limited thereto.

Preparation of Black Photosensitive Composition

Synthesis Example 1: (Preparation of 9,9-bis[4-(glycidyloxy)phenyl]fluorene of Formula 8)

20 g of 9,9'-bisphenol fluorene (Sigma Aldrich), 8.67 g of glycidyl chloride (Sigma Aldrich), 30 g of anhydrous potassium carbonate, and 100 mL of dimethylformamide were added into a 300 mL 3-neck round-bottom flask equipped with a distillation tube, and the temperature was raised to 80° C. and reacted for 4 hours. Then, the temperature was lowered to 25° C. and the reaction solution was filtered and the filtrate was added dropwise to 1,000 mL of water while stirring, and the precipitated powder was filtered, washed with water, and dried under reduced pressure at 40° C. to obtain 25 g 9,9-bis[4-(glycidyloxy)phenyl]fluorene. The obtained powder was subjected to purity analysis by HPLC and was shown to have a purity of 98%.

<Formula 8>

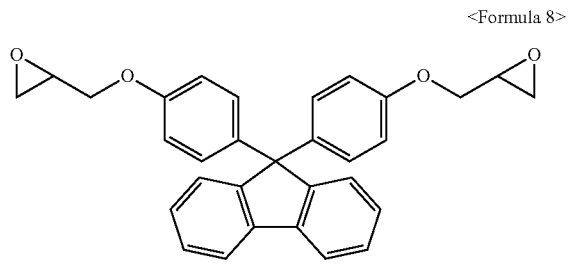 [SMILES: c1ccc2c(c1)-c1ccccc1C2(c1ccc(OCC2CO2)cc1)c1ccc(OCC2CO2)cc1]

Synthesis Example 2: Preparation of Cardo-Based Binder Resin 25 g (54 mmol) of Compound 1 obtained in Synthesis Example 1, 8 g of acrylic acid (Daejung Chemicals & Metals), 0.2 g of benzyltriethylammonium chloride (Daejung Chemicals & Metals), 0.2 g of hydroquinone (Daejung Chemicals & Metals), and 52 g of propylene glycol methyl ether acetate (Sigma Aldrich) were added into a 300 mL 3-neck round-bottom flask equipped with a distillation tube, and the mixture was stirred at 110° C. for 6 hours. After completion of the reaction, 8 g of biphenyltetracarboxylic dianhydride (Mitsubishi Gas) and 1.8 g of tetrahydrophthalic acid (Sigma Aldrich) were added thereto, and the mixture was stirred again at 110° C. for 6 hours. After completion of the reaction, the reaction solution was recovered and analyzed to obtain a cardo-based binder resin with a molecular weight of 4,580 and a solid content of 45%.

Preparation Example 1: Preparation of Black Pigment Dispersion 15 g of Irgaphor Black S 100 CF (black pigment/BASF), 8.5 g of Disperbyk 163 (BYK), and 6.5 g of SR-3613 (SMS), 70 g of propylene glycol methyl ether acetate, and 100 g of zirconia beads (diameter: 0.5 mm, Toray) were dispersed for 10 hours using a paint shaker (Asada) to obtain a dispersion.

The photosensitive composition solution was prepared with the composition shown in Table 1 below.

Specifically, the initiator was dissolved in a solvent, and the resultant was stirred at room temperature, and then a binder resin and a polymerizable compound were added thereto, followed by stirring at room temperature. Subsequently, a colorant and other additives were added to the obtained reactants and the mixture was stirred at room temperature.

Subsequently, the resulting product was filtered three times to remove impurities and thereby a photosensitive resin composition was prepared.

TABLE 1

| | Composition Ratio (%) |
|---|---|
| Black Pigment Dispersion (Preparation Example1) | 23 |
| Cardo Binder (Synthesis Example 2) | 15 |

TABLE 1-continued

| | Composition Ratio (%) |
|---|---|
| Miraemer M600 (Miwon Specialty Chemical) | 12.5 |
| PBG-304 (Trony) | 0.5 |
| Propylene Glycol Methyl Ether Acetate | 49 |

The method of preparing a negative pixel defining layer (negative PDL) using the photosensitive composition is as follows.

(1) Application and Coating Steps

A photosensitive composition is applied to a substrate on which a 10 cm*10 cm metal has been deposited using a spin coater to a certain thickness, and then a coating film is formed by removing some of the solvent using vacuum chamber dry (VCD). The coating film of the photosensitive composition is formed to have a thickness of 1.7 μm to 2.0 μm after VCD.

(2) Pre-Baking Step

In order to remove the solvent contained in the obtained coating film, the film is heated on a hot plate at 80° C. to 120° C. for 50 seconds to 200 seconds. By removing a certain amount of solvent in the process, it is possible to reduce pixel-shaped mask contamination and create a clean pattern in the following process (exposure to light).

(3) Exposure to Light Step

After interposing a pixel-shaped mask to obtain a pattern and a constant thickness required for the obtained coating film, a pattern can be formed by irradiating a light source of a metal or LED lamp having an active line of 190 nm to 600 nm, preferably a ghi-line, through a light exposure device. The amount of exposure to light irradiated for pattern formation is 20 mJ/cm² to 150 mJ/cm², and it is a negative-type photoresist material to be formed.

(4) Developing Step

Following the exposure to light step, when washing with DI water after developing at 23±2° C. with a 2.38 wt % tetramethylammonium hydroxide (TMAH) developing solution by the dipping method for a certain period of time (minutes), the part not exposed to light is dissolved and removed, leaving only the part exposed to light to thereby form an image pattern.

The thickness of the coating film is 1.70 μm to 1.90 μm.

(5) Post-Baking Step

In order to obtain the image pattern obtained by the developing, the solvent is completely removed by post-baking in an oven at 210° C. to 300° C. for 30 to 120 minutes, the pattern is cured to form a film, and the amount of outgas generation is measured.

(6) Measurement of Outgas

After forming a pattern on the substrate through the above steps (1), (2), (3), (4) and (5) with a photosensitive composition, the amount of outgas generation was measured in an area of 10 cm×10 cm. After post-baking, a film was prepared to have a coating thickness of 1.45 μm to 1.55 μm, and the weight was 11 g to 12 g after coating and post-baking the photosensitive composition on a 10 cm×10 cm substrate. The outgas was each collected at 250° C. for 30 minutes using the JTD-505² (JAI). After measuring the samples for toluene examination (5 ppm, 10 ppm, and 50 ppm) using the QP2020 GC/MS (Shimadzu), a calibration curve was drafted, and the amount of outgas of the collected samples was measured by extrapolation. The samples were compared with respect to each measured amount of outgas detected from the samples whose process conditions were changed, such as the developing time and temperature in the developing step, and the heating temperature and heat treatment time in the post-baking step.

(7) Evaluation of Device Reliability

When comparing the detection amount of outgas, the minimum and maximum amount of outgas detected was confirmed in each process condition, a pattern substrate of a pixel defining layer (PDL: pixel define layer) was formed according to each condition, and in order to evaluate the device reliability, organic materials were deposited and reliability verification factors (e.g., high-temperature operation, pixel shrinkage, dark spots, etc.) were confirmed.

(8) Method of Measuring Amount of Fume Generation

In the method of preparing a negative a pixel defining layer (negative PDL) using the photosensitive composition, the amount outgas detected from a formed film with 1.70 nm to 1.90 nm was confirmed in the developing step. Then, the amount of fume generated in the post-baking process was confirmed by subtracting the measured amount of outgas detected from a formed film with 1.45 nm to 1.55 nm after post-baking.

(Preparation of Device Substrate)

Figure 3:
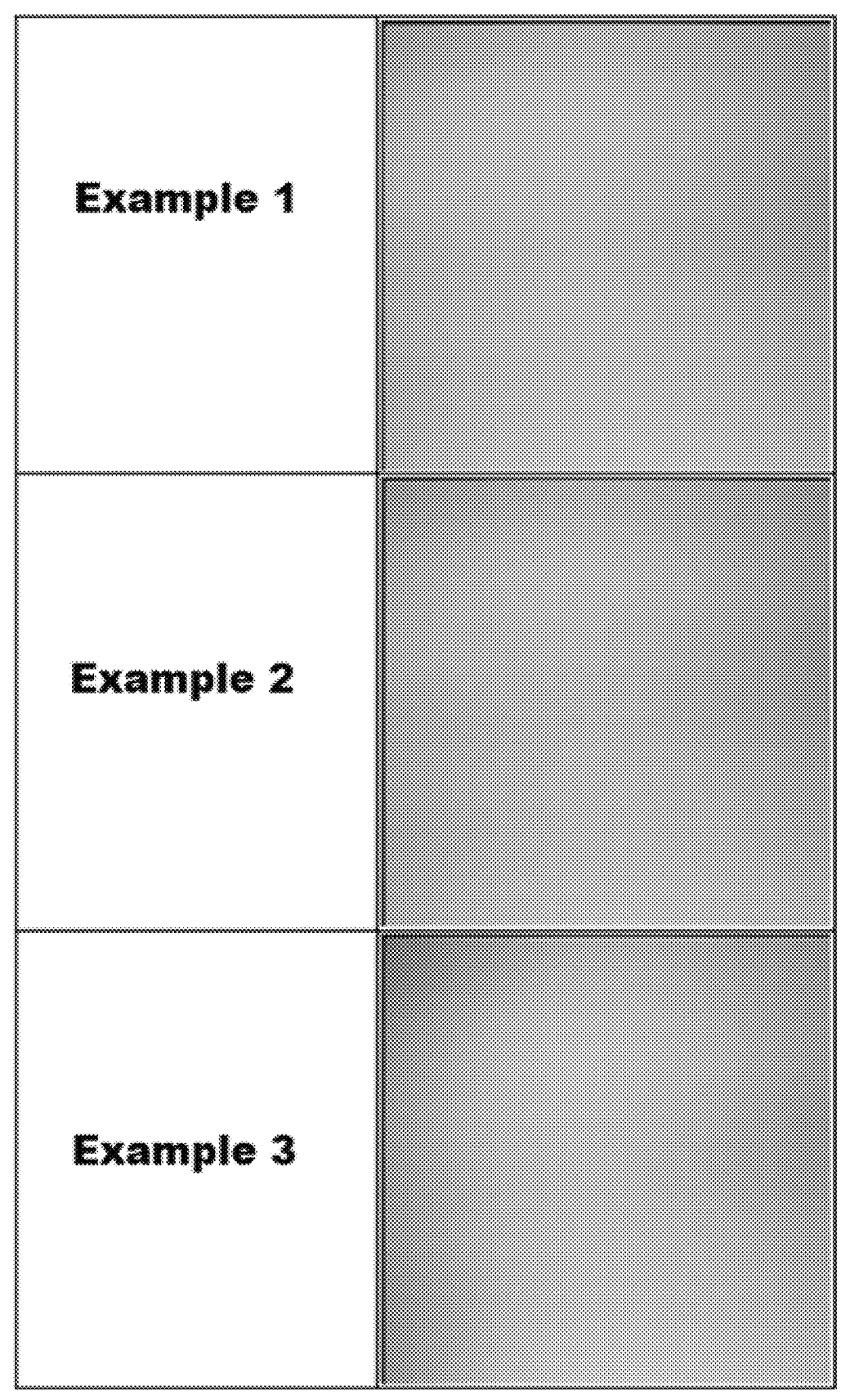
Figure 5:
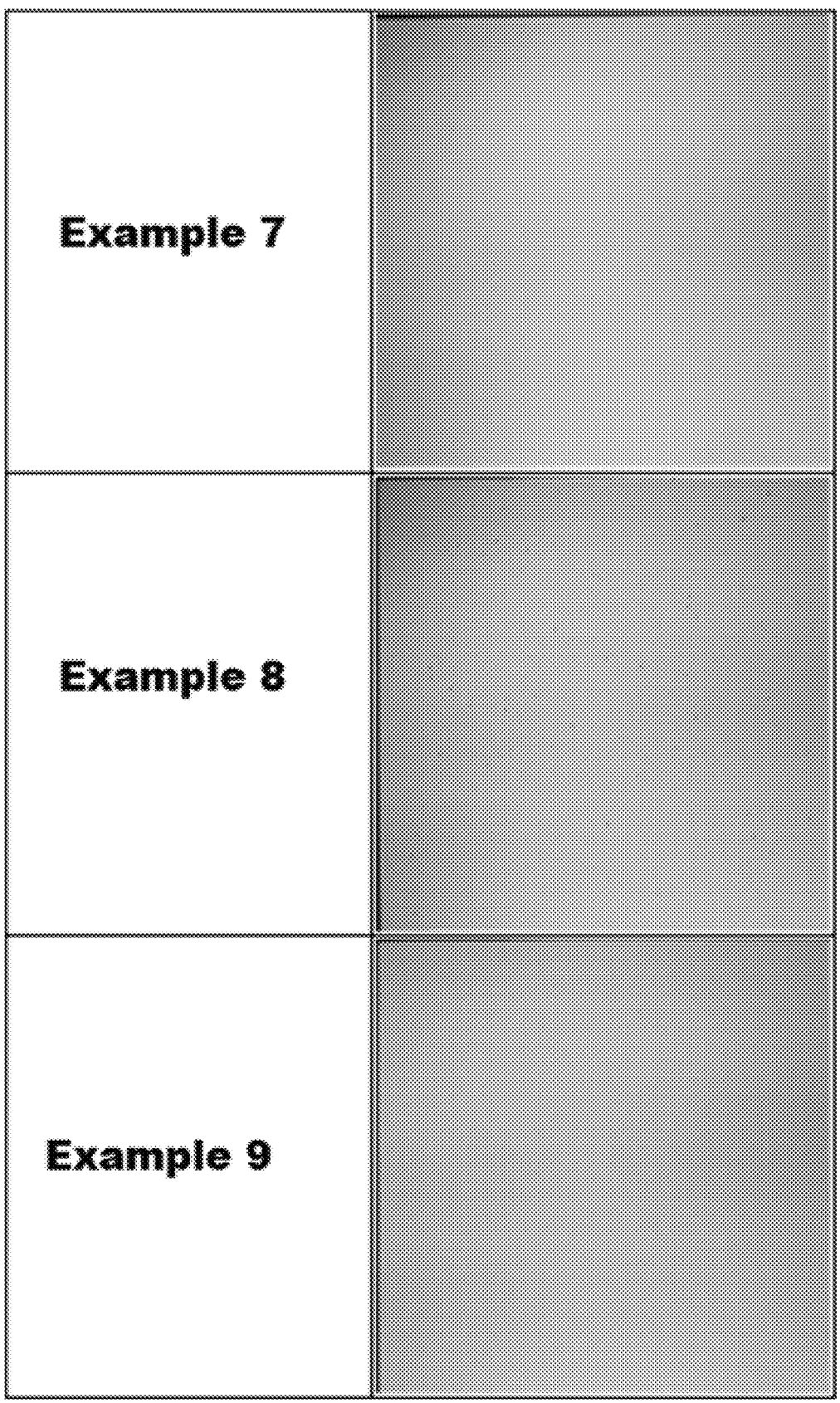

As illustrated in FIGS. 1 to 6, the electrodes of the OLED device substrate are formed on a glass surface with a thickness of ITO (80 Å to 120 Å)-Ag (900 Å to 1,100 Å)-ITO (80 Å to 120 Å), and a substrate for evaluation including a negative pixel defining layer formed through coating, exposure to light, developing, and post-baking with a composition containing a colorant on the electrode could be obtained. The physical properties of the substrate for evaluation satisfy a reflectance of 95% or more at 550 nm when measured with a UV spectrometer (UV-Vis. Spectrometer), and when the ITO surface roughness was measured with an atomic force microscope (AFM), it satisfied 2 nm or less.

TABLE 2

| | Post-Baking Temperature (° C.) | Post-Baking Time (Min) | Amount of Fume Generation (ppm) | Post-Baking Outgas (ppm) |
|---|---|---|---|---|
| Comparative Example 1 | 180 | 30 | 82.91 | 18.24 |
| Comparative Example 2 | | 60 | 83.79 | 17.36 |
| Comparative Example 3 | | 120 | 85.55 | 15.60 |
| Comparative Example 4 | 330 | 30 | 95.23 | 5.92 |
| Comparative Example 5 | | 60 | 95.39 | 5.76 |
| Comparative Example 6 | | 120 | 96.59 | 4.56 |
| Example 1 | 210 | 30 | 86.87 | 14.28 |
| Example 2 | | 60 | 88.23 | 12.92 |
| Example 3 | | 120 | 89.59 | 11.56 |
| Example 4 | 250 | 30 | 88.91 | 12.24 |
| Example 5 | | 60 | 90.27 | 10.88 |
| Example 6 | | 120 | 91.63 | 9.52 |
| Example 7 | 270 | 30 | 90.95 | 10.20 |
| Example 8 | | 60 | 92.31 | 8.84 |
| Example 9 | | 120 | 93.67 | 7.48 |
| Example 10 | 300 | 30 | 92.99 | 8.16 |
| Example 11 | | 60 | 94.35 | 6.80 |
| Example 12 | | 120 | 95.71 | 5.44 |

The amount of fume and out-gas generated on the substrate obtained in the process before and after the post-baking step were measured and compared. Referring to Comparative Examples 1 to 3 of Table 2 above, even if the post-baking time increased due to the low post-baking temperature, the amount of fume generated was less than 86 ppm, and as a result, it was confirmed that the amount of outgas generated after post-baking was 15 ppm or more. It was confirmed that when the amount of outgas increased after post-baking, outgas was generated during the operation of the device as shown in FIG. 1 and dark spots were formed. Referring to Comparative Examples 4 to 6, although the post-baking temperature exceeded 300° C. and the contents of fume and outgas were low, upon checking the image of the reliability the device below, it was confirmed that the pixel defining layer (PDL) layer could not tolerate the high temperature (320° C.), and pixel shrinkage occurred due to the outgas generated additionally during the operation of the device, and the pixel shrinkage developed more severely as the temperature increased for a longer time (60 min, 120 min).

Although the embodiments of the present disclosure have been described in detail above, it will be apparent to those skilled in the art that the scope of rights of the present disclosure is not limited thereto, but various modifications and variations are possible within the scope not departing the technical spirit of the present disclosure described in the claims.

What is claimed is:

1. A method for preparing a pixel defining layer comprising application and coating; pre-baking; exposure to light; developing; and post-baking of a photosensitive composition, comprising a cardo-based binder resin comprising Formula (1); a reactive unsaturated compound; a photoinitiator which has a molar absorption coefficient of 10,000 (L/mol·cm) or more in the region of 330 nm to 380 nm, and a 5 wt % loss occurring at 200° C. or less; and a solvent, wherein the post-baking step is performed at an oven temperature of 250° C. to 270° C. for 60 to 120 minutes; the amount of fume generated in the post-baking is 86 ppm or more; and the amount of outgas generated after the post-baking step is 15 ppm or less:

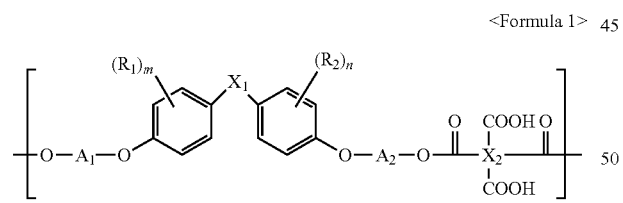

<Formula 1> wherein

1) $R^1$ and $R^2$ are each independently deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 2) m and n are each independently an integer of 0 to 4, 3) $A_1$ and $A_2$ are each independently Formula 2 or Formula 3:

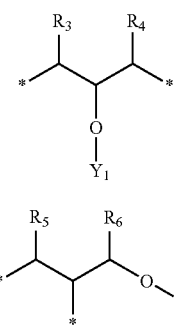

<Formula 2>

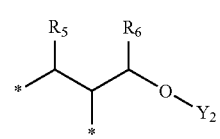

<Formula 3> in Formula 2 and Formula 3 above, 3-1) * represents a binding part, 3-2) $R^3$ to $R^6$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 3-3) $Y^1$ and $Y^2$ are each independently Formula 6 or Formula 7:

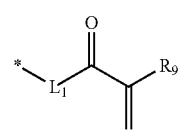

<Formula 6>

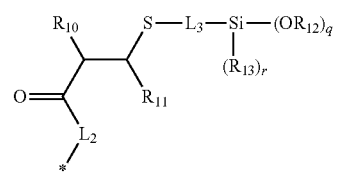

<Formula 7> in Formula 6 and Formula 7, 3-3-1) * represents a binding position, 3-3-2) $R^9$ is hydrogen or methyl, 3-3-3) $R^{10}$ to $R^{13}$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 3-3-4) $L^1$ to $L^3$ are each independently a single bond, a fluorenylene group; $C_{2-30}$ alkylene; $C_{6-30}$ arylene; a $C_{2-30}$ heterocyclic ring; $C_{1-30}$ alkoxylene, $C_{2-30}$ alkyleneoxy; $C_{6-30}$ aryloxy; or $C_{2-30}$ polyethyleneoxy, 3-3-5) q and r are each independently an integer from 0 to 3 with the proviso that q+r=3, and 4) the ratio of $A_1$ and $A_2$ in the polymer chain of the resin including a repeating unit represented by Formula 1 is 9:1 to 1:9, 5) $X_1$ is a single bond; O; CO; $SO_2$; CR'R"; SiR'R"; Formula 4; or Formula 5, 5-1) R' and R" are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, <Formula 4>

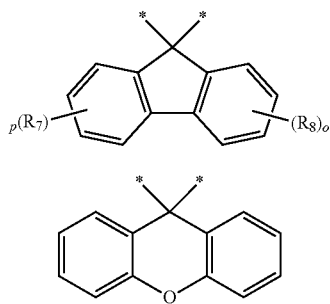

<Formula 5> in Formula 4 and Formula 5, 5-2) * represents a binding position, 5-3) $R^7$ and $R^8$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 5-4) o and p are each independently an integer of 0 to 4, 6) $X_2$ is a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenylene group; a carbonyl group; an ether group; or a $C_{1-20}$ alkoxycarbonyl group, and 7) the R', R", $X_2$, $L^1$ to $L^3$, $R^1$ to $R^8$, and $R^{10}$ to $R^{13}$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group comprising at least one heteroatom among O, N, S, Si, and P; a $C_{3-30}$ alicyclic group; a $C_{7-30}$ arylalkyl group; a $C_{8-30}$ arylalkenyl group; and a combination thereof.

2. The method of claim 1, wherein the photosensitive composition comprises a colorant.

3. The method of claim 2, wherein the colorant comprises one or more of inorganic dyes, organic dyes, inorganic pigments, and organic pigments.

4. The method of claim 2, wherein the colorant is included in an amount of 1 wt % to 40 wt % based on the total amount of the photosensitive composition.

5. The method of claim 2, wherein the colorant is pretreated using a dispersant; or a water-soluble inorganic salt and a wetting agent.

6. The method of claim 2, wherein the average particle diameter of the colorant is 20 nm to 110 nm.

7. The method of claim 1, wherein the photosensitive composition comprises a patterning resin which further comprises an acryl-based binder resin.

8. The method of claim 7, wherein the average molecular weight of the acryl-based binder resin is 3,000 g/mol to 150,000 g/mol.

9. The method of claim 1, wherein the average molecular weight of the cardo-based binder resin is 1,000 g/mol to 100,000 g/mol.

10. The method of claim 1, wherein the cardo-based resin is included in an amount of 1 wt % to 30 wt % based on the total amount of the photosensitive composition.

11. The method of claim 1, wherein the reactive unsaturated compound is included in an amount of 1 wt % to 40 wt % based on the total amount of the photosensitive composition.

12. The method of claim 1, wherein the photoinitiator is included in an amount of 0.01 wt % to 10 wt % based on the total amount of the photosensitive composition.

13. A pixel defining layer prepared according to the method of claim 1.

14. An organic light emitting display device comprising the pixel defining layer according to claim 13.

15. An electronic device comprising the display device of claim 14 and a control unit for operating the display device.

* * * * *